United States Patent [19]

Hsia et al.

[11] 4,398,248

[45] Aug. 9, 1983

[54] ADAPTIVE WSI/MNOS SOLID STATE MEMORY SYSTEM

[75] Inventors: Yukun Hsia; Richard W. Rodgers, both of Santa Ana, Calif.

[73] Assignee: McDonnell Douglas Corporation, Long Beach, Calif.

[21] Appl. No.: 198,472

[22] Filed: Oct. 20, 1980

[51] Int. Cl.³ .................... G11C 11/40; G06F 13/00
[52] U.S. Cl. .................... 364/200; 364/900; 371/10; 365/200
[58] Field of Search ............ 364/200, 900; 371/10, 371/11; 365/200, 228, 174; 307/238.1, 238.8

[56] References Cited

U.S. PATENT DOCUMENTS

| | | | |
|---|---|---|---|
| 3,810,117 | 5/1974 | Healey | 364/200 |
| 4,007,452 | 2/1977 | Hoff, Jr. | 365/200 |
| 4,092,733 | 5/1978 | Coontz et al. | 365/200 |
| 4,188,670 | 2/1980 | Hsia | 365/47 |
| 4,254,477 | 3/1981 | Hsia et al. | 365/200 |

*Primary Examiner*—Charles E. Atkinson
*Attorney, Agent, or Firm*—Gregory A. Cone; Walter J. Jason; Donald L. Royer

[57] ABSTRACT

The disclosed solid state mass memory system comprises an adaptive, wafer scale integration, nonvolatile mass memory system organized as a stack of individual memory wafer modules with a memory system control means.

13 Claims, 9 Drawing Figures

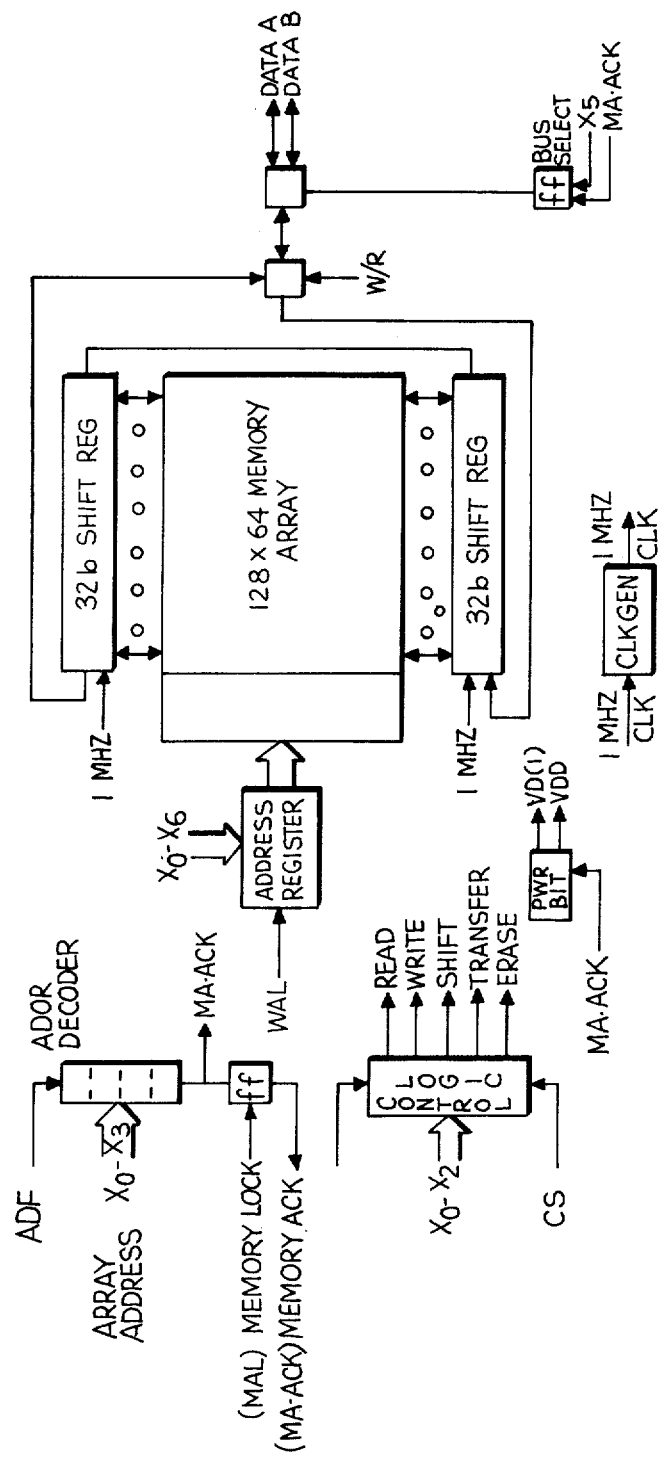

ADAPTIVE WSI/MNOS SOLID STATE MEMORY SYSTEM

BACKGROUND OF THE INVENTION

1. Field of the Invention

This invention relates to solid state mass memory systems. Still more particularly, this invention relates to adaptive solid state memory systems which employ stacked WSI reconfigurable memory wafers controlled by an off-wafer memory system control means.

2. Description of the Prior Art

Conventional mass memory systems can be conveniently divided into two groups, those involving magnetic media and those employing transistor technolgoy. Included within the magnetic media devices are the multitude of tape and disc drive memory systems. While these devices are relatively inexpensive in terms of a cost-per-bit criterion, the systems tend to the bulky, slow, and consume relatively high levels of power in their operation. Also included within the magnetic media magnetic systems are the magnetic bubble memory systems. Such systems represent an importatnt reduction in the size of the device but are still relatively high in power, limited in operating temperature rate, and slow in access time. All of the magnetic media memory systems posssess the important advantage of nonvolatility; that is, upon termination of power to the memory system, the data within the system is not lost and may be retrieved upon reapplication of power to the memory system.

The transistor implemented mass memory systems include MOS, bipolar, and CCD mass memory systems. These transistor implemented mass memory systems are much faster than those employing magnetic media.

Indeed, the bipolar mass memory systems are among the faster memories available today. Nevertheless, these memory systems are substantially more costly in terms of a cost per bit of storage criterion than are the magnetic media mass memorues; and perhaps most significantly, the transistor implemented mass memories are volatile. In other words, an interruption of power to these transistor implemented mass memories will cause a catastrophic effect in that none of the data in the transistor memory will be retained for retrieval upon a reapplication of power to the transistorized mass memory system. By way of a quick comparison, the adaptive wafer scale integration (AWSI) solid state memory system of this invention which employs nonvolatile MNOS transistor technology media memory systems in terms of cost per bit of storage, is nonvolatile, is highly reliable due to its adaptive reconfigurability, and has an access speed intermediate to the magnetic media mass memories and the other transistor implemented mass memories.

The mass memory system of this invention is based in large part on Metal Nitride Oxide Semiconductor (MNOS) transistor technology for both the nonvolatility of the data within the memory and for the adaptive reconfigurability of the components on the individual memory wafers by which the memory system achieves a very high reliability. The basic operation and method of fabrication for MNOS devices have been known for some time; see, for example, an article by M. H. White and J. R. Cricchi, "Characterization of Thin-Oxide MNOS Memory Transistor," IEEE Trans. Electron Devices, vol. Ed-19, pp. 1280-1288, 1972. In a nutshell, the MNOS transistor is a close relative of the conventional MOS transistor in that the usual layer of gate oxide is replaced by a 400 angstrom layer of silicon nitride over a less than 20 angstrom thick layer of silicon dioxide. The application of a moderately high voltage (approximately 20 volts) to the gate electrode of this transistor causes the thin silicon dioxide layer to become conductive or to permit charge carriers to tunnel through it. Charge carriers may then pass between the silicon substrate and the charge carrier traps located near the silicon nitride-silicon dioxide interface. The presence of trapped charge carriers at this interface modifies the gate voltage which controls passage of charged carriers from source to drain in the conventional operation of the transistor. The MNOS transistor is then said to have an OFF and an ON state, which depends on the concentration and the polarity of the trapped charge carries. These MNOS transistors, when suitably utilized in a circuit, effectively become the means with which electrically-alterable interconnections can be accomplished. The alterable interconnect can be so utilized because the interconnection has a nonvolatile memory for status control such that the state of an interconnected machine is static as if hardwired, yet it is alterable (or adaptive), via control signals from other circuit means.

Some of the most recent developments in adaptive reconfigurability of circuits involving MNOS transistors are represented by U.S. Pat. No. 4,188,670, by Yukun Hsia, issued Feb. 12, 1980, entitled "Associative Interconnection Circuit" and U.S. Ser. No. 954,627, now U.S. Pat. No. 4,254,477, issued Mar. 3, 1981, by Yukun Hsia, entitled "Reconfigurable Memory Circuit." Nevertheless, these references disclose only relatively small scale implementations of these circuits.

SUMMARY OF THE INVENTION

This invention utilizes adaptive wafer scale integration techniques and advanced MNOS transistor technologies for the design of a solid state mass memory system (SSM). The solid state memory itself can be roughly broken into two subsystems. One subsystem comprises the stack of wafer scale integration memory modules with the other subsystem comprising the control circuitry. Each modular memory chip within the memory stack comprises array controllers (AC), memory arrays (MA), and the buses which connect them. Interconnections on the individual memory chips are organized such that the small individual sequential access memory arrays, each with storage capacity in the range of 4K to 16K bits per memory array, are interconnected to result in a large capacity storage (greater than $10^5$ bits) on a single memory module slice. The use of the MNOS nonvolatile memory transistor in the memory modules results in a very low system power as compared with other semiconductor memories since power need be applied to only accessed storage arrays with no standby power necessary to maintain data in unaccessed storage arrays.

The memory control circuitry supplies the intelligence of the system. Not only does the system controller provide external interfaces, interpret the system commands, and supply detailed instruction sequencing to the wafers, it also monitors and controls the operation of all of the memory system components. Upon detection of a fault within the memory system, the system controller will execute a built-in test to isolate the fault and then reconfigure the system to remove the fault.

BRIEF DESCRIPTION OF THE DRAWINGS

FIG. 8 is a functional diagram of an indivudal array controller; and

DETAILED DESCRIPTION OF INVENTION

Figure 1:
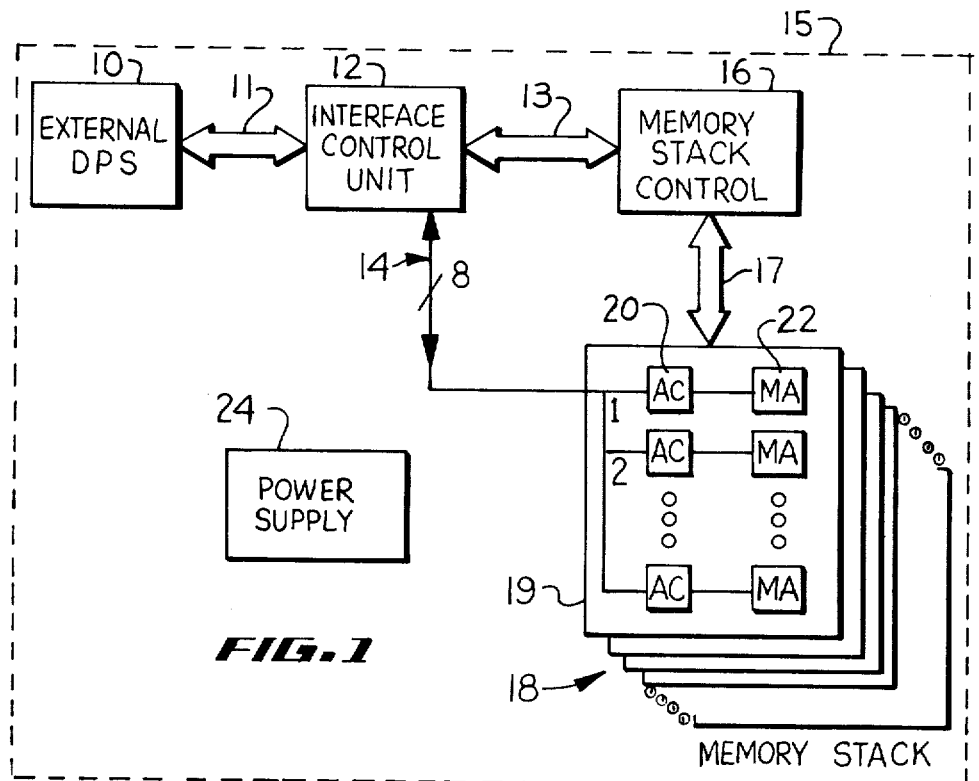
FIG. 1 is a functional block diagram of one basic configuration of the solid state memory system.

This invention combines the powerful concept of adaptive wafer scale integration (AWSI) with the rapidly emerging MNOS technology to create a novel solid state mass memory system with the important advantages of nonvolatility, very high reliability, compactness, low power requirements, and high speed. By way of introduction, both the AWSI and MNOS technologies will be briefly discussed in order that a more complete understanding of this invention be obtained.

Adaptive Wafer Scale Integration employs electrically alterable, nonvolatile interconnect controller circuits processed into a semiconductor wafer to connect "arrays" of interconnected operable circuits (also processed into the wafer) to a bus structure deposited on the wafer between the arrays. With this approach, AWSI can have important advantages relative to other high-density electronic circuit approaches. Such advantages include: repeated electronic reconfigurability of interconnected circuits; compatibility with a wide variety of semiconductor processes; ability to select for yield; improved reliability; self-repairing; self-healing; and fault tolerance, all with concomitant reduction in size, weight, and cost. AWSI technology is an extension of conventional integrated circuit (IC) technology and retains most of the characteristics of IC technology. One significant difference, however, is that in conventional IC fabrications a large number of individual "dice" or IC elements are fabricated individually upon the silicon wafer, while in AWSI the individual circuit elements, commonly referred to as "arrays" in AWSI, are all connected to system buses on the wafer. In both technologies the "dice" or arrays are probed immediately after the completion of wafer processing to test for operability of the individual circuit elements. In conventional IC technology the dice which do not pass the probe test are marked and discarded when the wafer is scored and then diced into the individual circuit elements for packaging. In AWSI the wafer is not diced into individual circuit elements. The addresses of the arrays that pass the probe test are stored in a nonvolatile memory. The operable arrays which are initially used in system mechanization are accessabile either via direct addressing or via associative decoder addressing. The remaider of the operable arrays are reserved as spares to be connected into the bus structure as replacements for operating arrays which are subsequently indicated as defective by built-in tests. Alternatively, the spares can later be used for system reconfiguration dependent upon application requirements.

To be sure, AWSI is not the only whole wafer method by which individual circuit elements may be interconnected upon an integral wafer. One method is to add another metalization step after the circuits or elements of the wafer have been tested to interconnect the operable elements one to another on the wafer. The difficulty with this method is that a different mask is required for each individual wafer, greatly increasing the cost of the finished product. Other methods involve permanent disconnection mechanisms to separate inoperable arrays from a system bus such as blowing a fuse, charging up a floating gate MOS (FAMOS) device, or laser burnout, etc. Although this method is suitable for wafer scale integration, it is limited in application. It requires a hardwired decoder and does not permit reconnection of the string of arrays for increased reliability. Another wafer integration scheme as described in U.S. Pat. No. 3,940,740 provides for spare rows and columns on the matrix for appropriate sparing in case of defective elements. One disadvantage of this configuration is that an entire row of elements must be provided in the worst case as a spare for a single defective matrix element. In addition, all of these methods require extensive decoding circuits and uniquely dedicated decoding bus lines for element enable which reduce the usable area of the wafer and add possible falure sites. Because of these reasons, wafer scale integration has seldom been achieved by other than AWSI techniques.

The use of a repeatedly alterable electrical interconnect processed into the wafer provides the principal advantages of AWSI as compared to the other wafer scale integration technologies. With AWSI, any array can be connected to or disconected from the bus structure at any time. Such connections can include both signals and power. Non enabled arrays require no power. Furthermore, conditional interconnect is accomplished electronically instead of by nonalterable mechanical means, such as the metalization masks or fusable links of the WSI technologies mentioned above. Spare operable arrays are stored on the wafer and are connected to the bus structure whenever built-in tests reveal that one of the active arrays has failed and must be replaced. Reconfiguration may be achieved within limits established by the system architecture by reconnecting arrays to the system bus structure.

The technological key to the AWSI interconnect ability is the nonvolatile semiconductor memory transistor, the MNOS transistor. This transistor is unique among solid state electronic devices in that it permits stored data alterability simultaneously with stored data nonvolatility. It also provides a small area structure and fabrication compatibility with high density integrated circuit technologies. The adaptive feature of the AWSI interconnect makes it possible to implement sparing to produce high reliability memory systems. A minimum number of spare memory circuits is set aside on each wafer. Upon detection of failure, the failed component is disconnected and a spare is connected to the system bus. Utilizing sparing redundancy, the high system reliability is accomplished with minimum hardware cost, and little increase in parts count. For the solid state mass memory system of this invention, on the wafer interconnect is mechanized such that small single sequential access memory arrays are interconnected to result in a large capaicty storage memory module on a single slice of silicon wafer.

As mentioned above, the memory system of this invention can be divided into wafer slice memory modules and control circuitry. The wafer memory modules consist of wafer memory slices which in turn consist of array controllers, memory arrays, and the buses which connect them upon reception of an appropriately coded enable signal from the control circuitry. The array controller can selectively turn on power as well as switching data and control information to the individual accessed memory arrays, leaving the unaccessed memory arrays in a power off condition, thereby minimizing the power consumption of the memory wafer stack.

It should be evident from the preceding AWSI discussion that a great deal of flexibility is possible in the design approaches leading to an effective solid state mass memory system employing this technology. The remainder of this specification will be devoted to one such design. However, it should be realized that other designs are possible, and the reader should refer to the claims to ascertain the true scope of this invention.

The basic structure of the present embodiment of the solid state memory (SSM) is shown in FIG. 1. This structure is as has been briefly discussed above in that the SSM comprises an interface control unit 12, a memory stack control 16, and a memory stack 18. The SSM further comprises various signal and power pathways 11, 13, 14, 17, and a power supply 24. The SSM itself interfaces through a signal path 11 to an external data processing system 10. The particular data processing system contemplated with this embodiment is the NAVY TACTICAL DATA SYSTEM characterized as AN/UYK-20 DPS. The memory stack 18 comprises a pularity of individual memory wafers 19. On each such wafer are a plurality of array controllers (AC) and memory arrays (MA) 22. In this configuration eight MA's are accessed in parallel. The eight MA's, each with one active I/O, provide a byte of data upon a single clocked access. A decoded access to one wordline to the MA storage arrays requires 64 clocked accesses resulting in 32 words of data access. The byte serial organization of the MA in the memory stack is chosen in order that a storage sector of 32 rods can be defined for short access latency time. The separation of control functions into the interface controller 12 and the memory stack controller 16 enables cost effective "technology insertion" of the SSM into existing hardware systems and simultaneously provides for great flexibility for the application of the SSM into future data processing systems. In other words, the interface controller can be easily redesigned to adapt to different external data processing systems without the need to redesign the totality of the SSM.

The integration of the memory stack requires a storage of a unique address code in the associative memory of each operating array controller circuit on the memory slices. The physical address of each operable MA is previously stored in a nonvolatile section of the operating AC circuit. An address table is used to translate the data word address from the computer into the physical address of the MA. System timing precludes reading the address table directly from the nonvolatile storage. Therefore, RAM's are used to implement this indirect addressing scheme for memory access. A memory setup instruction is needed on system power up to write the address table from the memory stack into the volatile RAM's.

Figure 2:
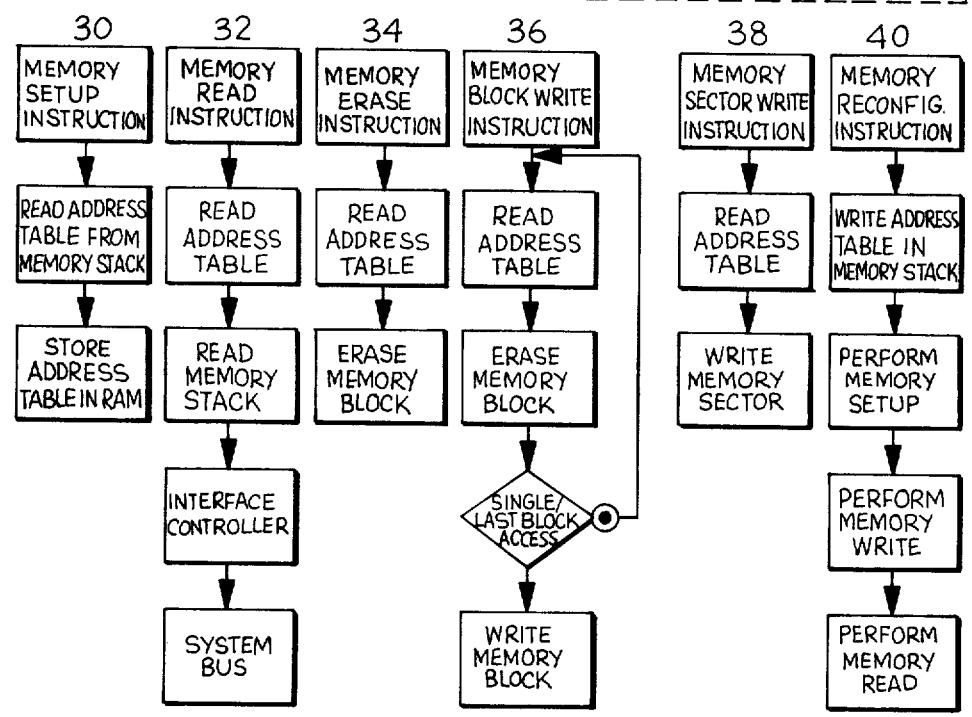
FIG. 2 is a series of flowcharts portraying one set of memory operation instructions for the solid state memory system.

The indirect addressing scheme for data access is utilized in all memory data access operations of the SSM. FIG. 2 summarizes the memory operation instructions of the SSM. They include the previously mentioned SETUP 30, READ 32, ERASE 34, BLOCK WRITE 36, SECTOR WRITE 38, and RECONFIGURATION 40. The READ command initiates NDRO (nondestructive readout) data read, a minimum of one subsector of data or serially through multiple subsectors and sectors of data. The ERASE command erases a block of 4096 consecutive words of data. The BLOCK WRITE command writes in the memory a minimum of one block of data or serially through multiple blocks of data. The SECTOR WRITE instruction writes in one subsector or several consecutive subsectors and sectors of data to storage locations that have previously been erased. The MEMORY RECONFIGURATION instruction writes new addresses to the address table in the memory stack, thus altering the physical address configuration of the memory system. The memory SETUP instruction is then executed in order that the current address table is in the RAM for memory access. A memory SECTOR WRITE and READ instruction may then be executed as part of a built-in test program to validate successful execution of the memory RECONFIGURATION instruction.

SSM SYSTEM PERFORMANCE CHARACTERISTICS AND DESIGN FEATURES

The present SSM has been designed to be implemented upon four-inch diameter silicon wafers using a four micrometer NMOX process. Total storage capacity is 44 megabits, of which four megabits are provided as spare storage for self repair. The data format is 16 bits/word. Random access for READ and WRITE to a subsector of 32 words is permitted. The sector WRITE operartion is valid only if the storage location has previously been erased. READ is NDRO. For READ, access time to the first subsector of data is under ten microseconds, and READ data rate is at 500 kilowords (eight megabits) per second. Since individual data subsectors are randomly accessable, the average latency time for access can be given as 32 microseconds, since it takes only 64 microseconds to read out a subsector completely.

Two WRITE operations are permissible: one (BLOCK WRITE) in which a block or several contiguous blocks of data are to be written, and two (SECTOR WRITE) in which a subsector or several contiguous subsectors and sectors of data within a data block are to be written. With the BLOCK WRITE command, the address block is first erased for 250 microseconds, then data to be written are serially input into the memory. In the case in which several contiguous blocks of the data are to be written, while a first block of data is being written, the subsequent block location is erased in preparation for data writing. WRITE data rate is 120 kilowords per second. The SECTOR WRITE assumes that the block being accessed has previously been erased. SECTOR WRITE data rate is 120 kilowords per second. Access time for this operation is ten microseconds.

The operating temperature range of the SSM is −55° C. to 100° C. and the temperature storage range is 31 55° C. to 125° C. The reduction in volume, weight, and power achieved with the SSM in comparison to conventional storage devices is impressive. For prototype units, the SSM is less than 150 cubic inches in volume, ten pounds in weight (exclusive of power supply), and five watts of power dissipation. A key design feature of the memory is the ability to provide built-in sparing redundancy for self repair in order that a reliability of 0.95 for five years is possible. Table 1 below summarizes the performance characteristics and design features of the SSM.

TABLE 1

SSM PERFORMANCE CHARACTERISTICS AND DESIGN FEATURES

| | |
|---|---|
| Access Time | |
| Read | 10 microseconds |
| Erase | 250 microseconds |
| Data Transfer Rate | |
| Read | 8 megabits/second |
| Write | 2 megabits/second |
| Average Latency Time | |
| Read | 32 microseconds |
| Power | 5 watts |
| Data Storage Format | |
| Subsector | 32 words |
| Sector | 256 words |
| Block | 4,096 words |
| Total Storage Capacity | $2.75 \times 10^6$ words |
| Operating Temperature | $-55°$ to $100°$ C. |
| Storage Temperature | $-55°$ to $125°$ C. |
| Volume | Less than 150 in$^3$ |
| Weight | 10 pounds (power supply extra) |

INTERFACE CONTROL UNIT

Figure 3:
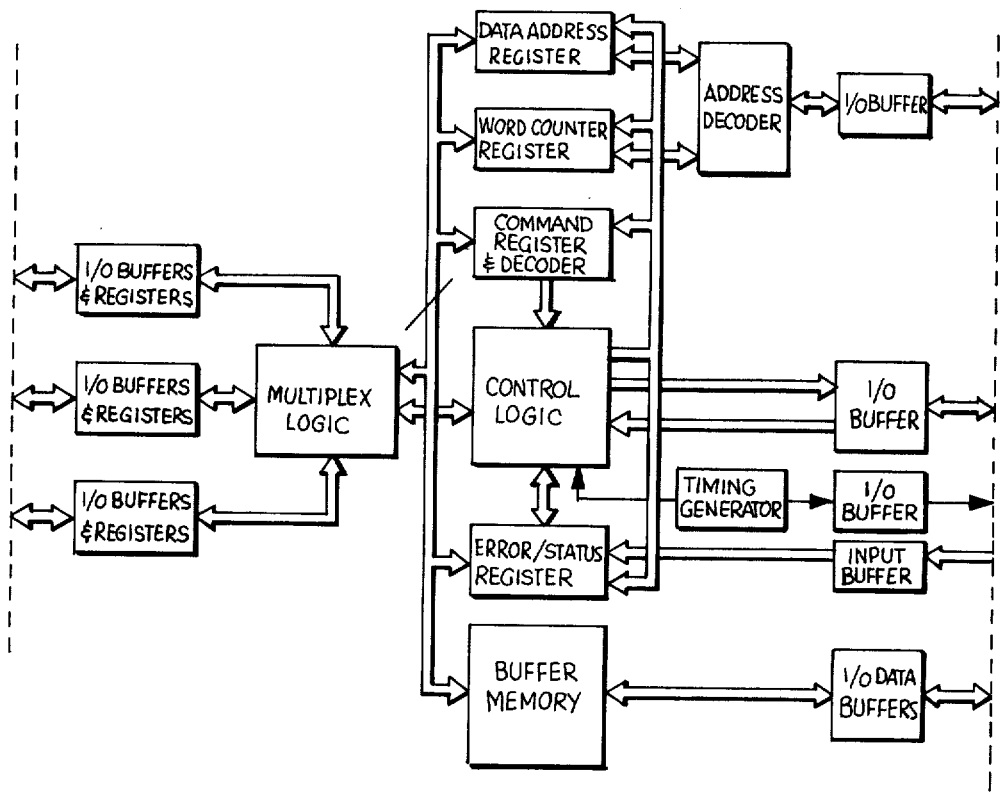
FIG. 3 is a functional block diagram of the interface controller.
Figure 4:
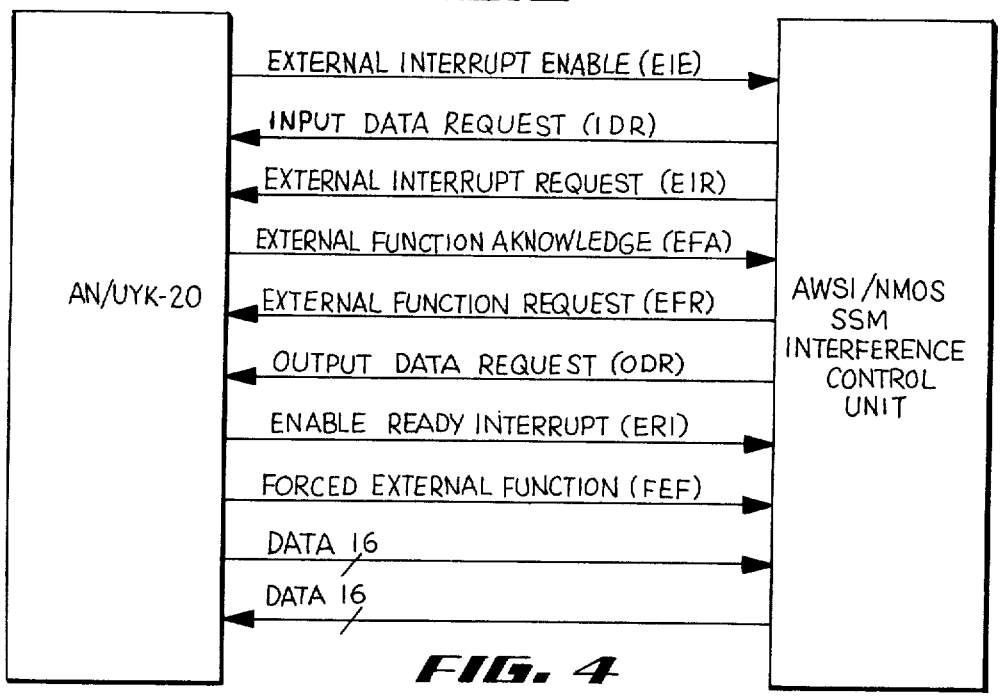
FIG. 4 is a diagram of an interface between the solid state memory and an external data processing set.

The interface control unit is the first level of control in the SSM system and serves two major tasks. A functional diagram of the interface controller is shown in FIG. 3. The interface controller provides the functional interface between the SSM system and the external data processing system (DPS). The interface between the SSM and one particular external DPS, the Navy AN/UYK-20, is shown in FIG. 4. The interface controller also provides and interface with the memory stack control unit and, as such, generates address, timing, and control signals based on external DPS commands that initiate instruction sequences in the memory stack control unit for memory read, write, erase and reconfiguration operations. The interface control unit is partitioned according to task into two sections that are synchronously clocked. The first section interfaces with the external DPS and includes I/O data and control buffers to provide digital signals in conformance with the specifications for the external DPS. In addition, multiplex logic either responds to the first channel External Function Acknowledge (EFA) command or assigns priority to channel port 1 if simultaneous EFA signals are received. An External Interrupt Enable (EIE) latch is also included at each multiplexed port. If this latch is set by an EIE request, the status of the SSM system will be set to the interogating channel after a data transfer operation is completed. If not set, the accumulated status word for the system is reset by the next command that initiates a memory operation. Also included in the external interface section are four registers with parallel tristate I/O's that share a common 16-bit data bus and data buffer memory. The four registers consist of the following: (a) a Word Count Register (WCR) that is initially loaded immediately after a read, write, or configuration command with the number of 16 bit words that will be transferred between the memory stack and the external DPS; (b) a Data Address Register (DAR) that is loaded after the WCR with a nine bit data block (track) address and a seven bit sector address; and (c) a Status/Error Register (SER). The fourth register that interfaces with the external DPS is a command register from which all SSM system operations are initiated. Upon receipt of an EFA signal accompanied by a 16-bit command word, the contents of this register are decoded and executed by the control logic section until such time as the stacked control unit outputs a return EFR indicating that an entire data block transfer is completed or until a DPS issues a master clear. The command word contains coding for the operation code read status and master clear.

The second interface control unit section includes a 256 16-bit buffer memory, timing generator, and memory address decoder. The buffer memory performs a 16-to-8-bit transformation on the data. During memory write, 256 16-bit words are loaded from DPS into the buffer and the data is then transferred to the memory stack in 8-bit bytes. During memory read the data transformation is reversed. This buffer technique reduces interface lines to the memory stack and the number of memories that must be addressed and powered for each data sector.

The timing generator functions at a 1.0 MHz rate and is used to synchronize all commands and data transfers between the interface control unit, memory stack control unit, and the memory stack. The interface between the external DPS and the SSM system is asynchronous and is controlled by hand shaking control signals. The address decoder utilizes track and sector addresses along with the contents of the word register (WCR) to generate virtual addresses for each data block and sector within the memory stack. Feedback between this decoder and an address counter in the memory stack control unit permits data blocks in the memory stack to be conditionally transversed for manipulation of data strings that exceed the capacity of a single data block.

MEMORY STACK CONTROL UNIT

Figure 5:
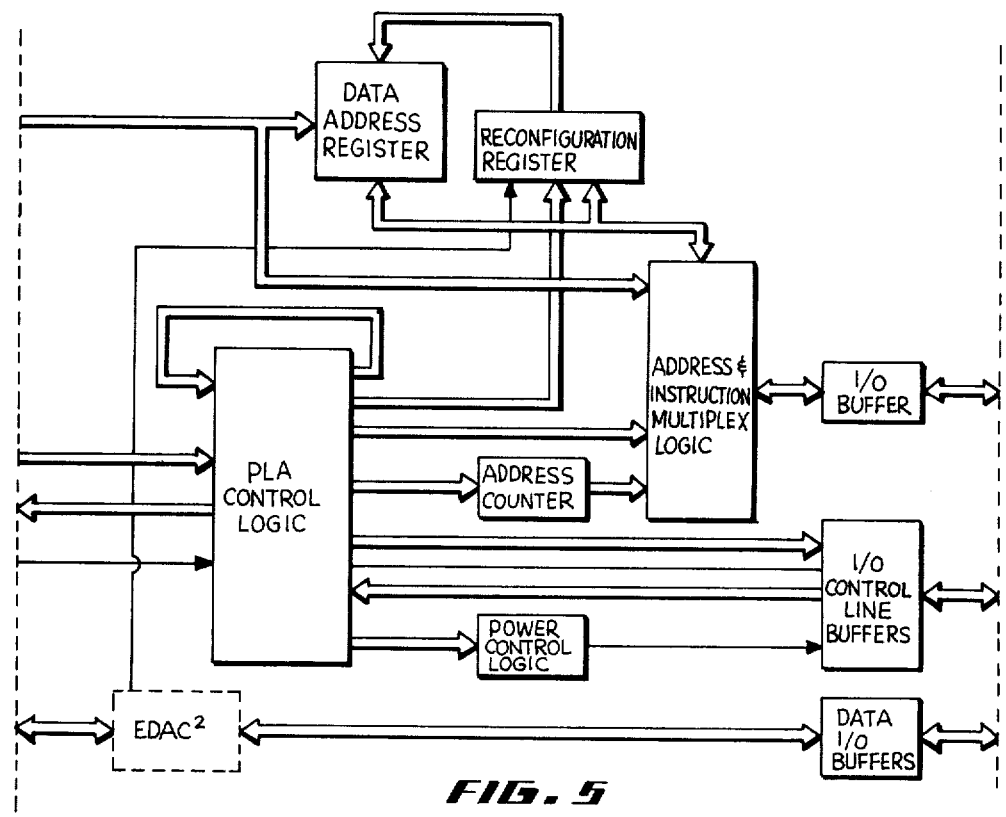
FIG. 5 is a functional block diagram of the memory stack controller.

The memory stack control unit is designed to serve with a nonvolatile memory stack. A functional block diagram of the memory stack controller is shown in FIG. 5. The control unit interprets basic system read, write, erase and memory reconfiguration commands issued from the interface control unit and generates a series of address and instruction sequences for manipulation of the data files in the memory stack. The data addresses are derived from a data address register. The instruction sequences are generated from an internal programmed logic array (PLA) and are synchronized by timing generated in the interface control unit as well as by interface control lines between the memory stack control unit, the memory stack, and the interface controller.

Prior to the actual execution of a system command, the stack control unit translates the starting block and sector address issued by the interface control unit to actual data locations in the memory stack. This translation is performed with an internal address file RAM and is accomplished by the sequence described in the following paragraph.

In the first addressing step, the block address issued by the interface control unit points to a RAM file location containing a memory slice address. The address is sent with an array decoder off (ADF) and memory array address lock (MAL) control signal to the memory stack. If an address match occurs, the addressed slice responds with an acknowledge signal, and the stack control unit addresses the next RAM location that contains the address of an array controller (AC). Once addressing of the AC is acknowledged, the memory stack control unit immediately fetches from RAM the virtual addresses of two memory arrays whose physical location is mapped in the activated AC. The sequence of addressing an AC and then two MA's is performed a total of four times by the memory stack control unit and results in access to eight MA's representing a data block of 4096 words. This addressing technique not only provides fast and efficient program control to required data blocks, but permits the data blocks to be reconfigured with spare units, since neither the memory slice AC or MA addresses are dependent upon the interface control unit block address.

Sectors of 256 words in a data block are addressed by means of an address counter that is preset by the sector address issued from the interface control unit. Feedback between the word count register and the interface control unit and the address counter and the memory stack control unit is used to permit automatic manipulation of data strings that traverse data blocks. As an optional feature, subsectors of 32 words can be accessed during data read if a second word count register is incorporated into the interface control unit. Data erase operations are restricted to blocks of 4096 words due to the organizational structure of the memory arrays. Sectors of 256 words (32 word subsectors with additional WCR) can be accessed for write operations with the restrictions that the entire data block containing the access sector is erased prior to write and that all data bits in a sector that has been erased but not written shall be at a positive logic 1 state.

For each system command issued from the interface controller, the memory stack control unit generates the following operating instruction sequences: an input read command initiates an output read, data transfer, and finally a shift instruction that transfers data out of the stack at a 1 mb/s rate; an input write command initiates a shift, data transfer, and a write instruction. During this sequence, 32 words are shifted into the memory in 250 microseconds. The write instruction requires 250 microseconds; however, this time delay is effectively masked from the system because the memory stack control unit shifts in the next succeeding 32-bit word during the write period. Each of the above instructions, as well as address codes for the memory slice AC and MA, is multiplexed in the memory stack control unit to minimize interconnect to the memory stack. The stack differentiates between instruction and addresses by control signals generated from the stack controller.

In addition to generating address and instruction codes, the stack control unit has a reconfiguration routine that is initiated by command from an external DPS via the interface control unit and is used to replace defective MA's or AC's in a data block with known good spare units. The reconfiguration is accomplished by replacing the address of a defective unit in the nonvolatile address file of the SSM with that of a spare unit, erasing the address of the replacement unit from the nonvolatile spare address file in the stack, and then rewriting the contents of the RAM with the updated address file from the SSM. The effectiveness of this reconfiguration technique is dependent upon knowing the address of the defective unit(s).

A possible option which may be utilized in the memory stack control unit is an error detection, coding, and correction (EDAC$^2$) unit coupled with an error memory file. Such an EDAC$^2$ unit will not only increase system reliability by correction of single bit transient or steady state errors, but will expedite location and reconfiguration of defective memory components.

MEMORY SLICE

Figure 6:
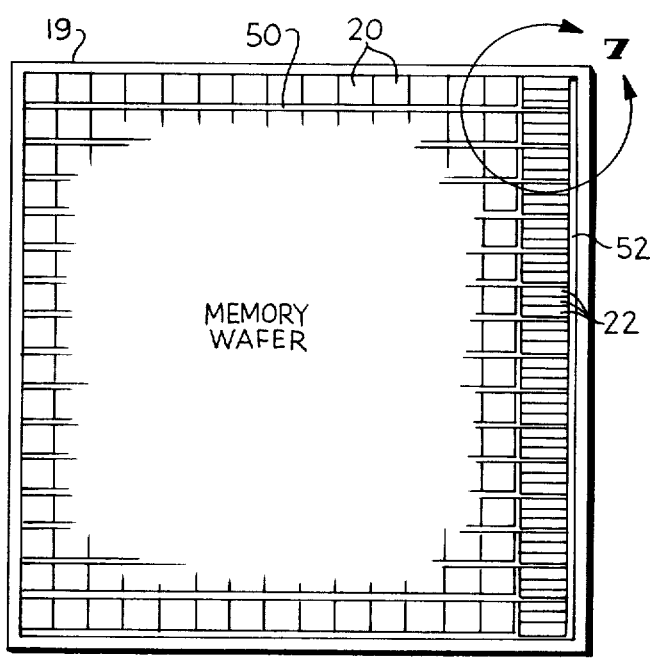
FIG. 6 is a plan view of an individual memory wafer slice.
Figure 7:
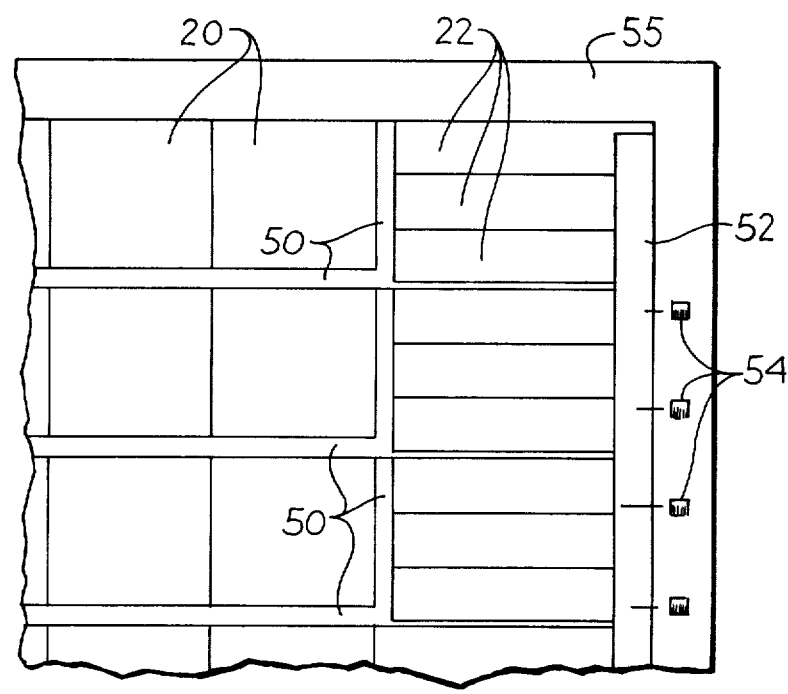
FIG. 7 is a detailed view of a portion of an individual memory slice.

As mentioned above, the memory stack consists of a plurality of individual memory slices. Each silicon memory slice measures $2.82 \times 2.82 \times 0.015$ inches and incorporates 224 nonvolatile memory arrays (MA's) arranged in a 16 row by 14 column matrix. The memory arrays in each row share a common X- bus composed of 15 inches that interface to the three array controller units (AC's) located at the right side of the row. A planned view of the functional side of the silicon wafer is shown in FIG. 6. The memory wafer slice 19 is divided into a 14 column by 16 row matrix of memory arrays 20 bounded on the right side by a further column of array controllers 22. Information transferral between the array controllers 22 and the memory arrays 20 is provided by the X- bus 50. Information transferred between the array controllers 22 and the other system components is provided by the Y- bus 52. FIG. 7 is a detailed view of the upper right portion of an individual memory slice showing the memory arrays 20, the X- bus 50, the array controllers 22, the Y- bus 52, the slice bonding pads 54, and the small inactive area 55 which surrounds the outside perimiter of the functioning components of the memory slice.

One row of the memory slice then comprises 14 individual memory arrays and three array controllers which are interconnected by an X- bus. The X- bus serves as a pathway for information and control signals between the single operating array controller and the addressed memory arrays. An individual X- bus has 15 lines which are dedicated as indicated below in Table 2.

TABLE 2

X- BUS ORGANIZATION

| ARRAY CONTROLLER (AC) Bits | | MEMORY ARRAY (MA) |
|---|---|---|
| 7 | $\Longrightarrow$ | MA Address or Control ($X_0$-$X_6$) |
| 1 | $\longrightarrow$ | MA Address Lock (MAL) |
| 1 | $\longrightarrow$ | Word Address Load (WAL) |
| 1 | $\longrightarrow$ | Control Sequence (CS) |
| 1 | $\longleftarrow$ | MA Acknowledge |
| 2 | $\Longleftrightarrow$ | Data |
| 1 | $\longrightarrow$ | 1 MHz Clock |
| 1 | $\longrightarrow$ | MA Decoder Off (ADF) |
| 15 | | |

Bus lines MAL, WAL, and CS are control signals generated from an array controller that differentiate between three sets of code words multiplexed on bus lines $X_0$-$X_6$. The memory array address lock (MAL) signal enables address decoders in each MA, the word address load (WAL) signal enables the memory address registers, and the control sequence (CS) enables the MA instruction latch. The 7-bit code word on ($X_0$-$X_6$) supplies both the addresses needed for the MA and memory word addressing and the MA instruction operation codes. When received in conjunction with the MAL, the code word contains a five bit MA address and a data bus select bit. There is no exclusive addressing capability built into the MA's. Once a specific MA is addressed, powered up, and locked on to the X bus, the MA can be unlocked only by removing power from the X- bus. When an MA is addressed and locked to the X bus, an array acknowledge (MA-ACK) signal is sent back to the AC. The WAL signal causes a 7-bit word address on ($X_0$–$X_6$) to be loaded into the memory address register. The CS signal when received with a four-bit code word enables the MA instruction decoders and latches.

A fourth special control line, the array decoder off (ADF), has no connection with the control word. Its function is to force the MA decoders into a lower power standby state. This is used during the extended write and erase operations to reduce system power.

All four of the control signals, MAL, WAL, CS, and ADF, are generated in the AC according to the AC instruction decoding. The only control word originating in the AC is the MA address needed for an array lock. All other MA control words originate in the system controller and are merely buffered and directed from the Y- bus to the X- bus through the AC. An X- bus becomes active only when one of its corresponding AC's is locked onto the Y- bus. When a successful AC lock occurs, power is directed onto the X bus and remains until power is removed. Information is passed along the X bus only while an AC remains actively locked onto the Y bus. Information may not be present on the X bus when power is applied thereto. The remaining X bus lines are the bidirectional data lines, the A and B data buses and a one MHz clock line. These lines are used together for shifting data in and out of the MA's. Three lines distribute power to the MA's.

In most instances, defective MA's along an X bus row will manifest isolated faults that do not affect adjacent arrays. In such cases, the AC does not access or power the defective MA by virtue of its internal address map of only functional arrays. In the less probable failure mode where a defective MA causes adjacent memory arrays to be inoperative or inaccessabile, the entire row of MA's associated with the defective memory array is abandoned by not addressing the row AC. Since the X bus for a row is buffered and row power is switched at each AC, catastrophic MA or X bus faults are isolated to a single row and are not propagated throughout the memory slice. To provide for sparing in the event of an active AC failure and for increased access yield to functional arrays, each row of MA's is provided with three redundant AC's. All AC's in the memory slice are interconnected along the right side of the slice by a common Y bus; and each line in the bus is, in turn, connected during fabrication of the slice to a bonding pad.

The Y bus is composed of 22 lines, as indicated in Table 3 below, and interfaces the AC's and a memory slice to the external memory stack control unit. The associative decoder lock (ADL), the array controller address lock (ACL), and the instruction command (IC) within this bus carry signals generated in the memory stack control unit which differentiate between three sets of code words multiplexed on $Y_0$–$Y_7$. These code words supply addresses for the memory slice and specific AC's as well as AC instruction operation codes. When used in conjunction with the associative decoder lock (ADL) signal, the eight-bit code word activates all AC's in a specific memory slice in preparation for the next level of addressing. When the AC address lock (ACL) is used with a code word, the word is interpreted as a six-bit AC address. The instruction command signal (IC), when received with a code word, enables the AC instruction decoders. The additional Y bus lines are concerned with data transfer, acknowledge flags, and a 1 MHz clock.

TABLE 3

| Y- BUS ORGANIZATION | | |
|---|---|---|
| MEMORY STACK CONTROL UNIT | | ARRAY CONTROLLER (AC) |
| Bits | | |
| 8 | ⟹ | Address and Control ($Y_0$–$Y_7$) |
| 1 | ⟶ | Associative Decoder Lock (ADL) |
| 1 | ⟶ | AC Address Lock (ACL) |
| 1 | ⟶ | Instruction Command (IC) |
| 1 | ⟵ | AC Acknowledge |
| 1 | ⟵ | MA Acknowledge |
| 8 | ⟷ | Data |
| 1 | ⟶ | 1 MHz Clock |
| 22 | | |

Access to a specific memory slice within a stack is accomplished by means of an associative decoder in each AC within a memory slice. The associative decoders incorporate eight nonvolatile memory bits that can be electrically programmed to establish a unique address for the slice. When a memory slice address (ADL) and control signal are presented to the memory stack, the nonvolatile memory decoder bits and all active AC's are associatively compared to the supplied address. If an address match occurs, an active bit is set in all AC's in the addressed memory slice, and the slice is primed to receive additional addressing and power control instructions. The advantages of utilizing an electrically programmable associative address decoder for each memory slice are twofold. The memory slices can be manufactured as universal units and, secondly, the slices within the assembled memory stack can be externally reconfigured to meet various system requirements.

ARRAY CONTROLLER

The array controller (AC) is the intermediate level of control between the external memory stack control unit and the memory arrays in a memory slice. The AC's serve to connect the Y bus to selected X buses in the memory slice, thus allowing external data and commands to be directed to specific memory arrays. No actual data operations are performed in the AC's; however, they maintain addressing and reconfiguration control over their respective rows of MA's and the memory slice address.

The functional organization of an array controller is shown in FIG. 8. The array controller is made up six major sections: an associative memory decoder containing eight programmable nonvolatile bits representing a memory slice address 60; a hardwired decoder containing the AC address 61; a data bus multiplexer 62; an instruction decoder and control logic section 63; a programmable memory array map and spare array register

64; and an address bus multiplexer 65. Each of these six sections is small, and the size of the AC, including the Y bus, is approximately 56×300 mils.

The array controller contains three power bit switches and is accessed by two sequential levels of addressing. During the first level of addressing, power is applied from the Y bus to the associative memory decoder, and the eight internal nonvolatile memory (NVM) bits are read out and compared within the decoder to a memory slice address. If a match is detected between the NVM bits and the slice address, a power bit is set, and power is applied to the hardwire AC decoder. In the second level of addressing, an eight-bit address is presented to the array controller. Six of these bits are compared in the hardwired decoder and, if a match is detected, an AC and X bus power bit are set. The AC power bit switches power to the memory array map, spare array register, and control logic used for addressing and reconfiguration of the MA's. The X bus power bit switches and maintains power to all addressed MA's and to the data and control routing logic in the AC. Both power bits have an independent reset. The AC bit is reset immediately after AC addressing or reconfiguration to minimize power dissipation. The remaining two of the eight address bits are presented to the AC and decoded in the control logic section. They are used to control latches in the data bus multiplexer. These latches determine which pair of lines on either the C or D bus is selected for bi-directional communication within the X bus and external control system.

The MA's within an addressed array controller row are indirectly accessed by means of the memory array map. This map is organized as 16 words by five bits per word and is word-erasable only. Two nonvolatile memory elements are used per bit, and the state of each bit is detected by latching sense amplifiers. MA addresing is accomplished within a four-bit address to the array map along with a control signal. The four-bit address is decoded and a five-bit word is gated from the map to the X bus. Four of these bits represent the address of a functional MA, while the fifth bit establishes whether an A or B data line is used in the selected MA for bi-directional communication to the AC. Besides storing the addresses of the functional MA's, the array map also stores the current value of a spare array counter (SAC) for reconfiguration. The SAC is five bits, and its contents can be written into the array map, loaded from the array map, or incremented. The contents of the SAC are detected by the external system during reconfiguration by incrementing the SAC to the zero state.

The instruction decoder and control logic section decodes commands from the Y bus for control of the AC power switches, erase and write of the array map, and incrementing and loading the SAC. The address bus multiplexer establishes whether MA addressing or control information are switched to the X bus.

MEMORY ARRAY

Figure 9:
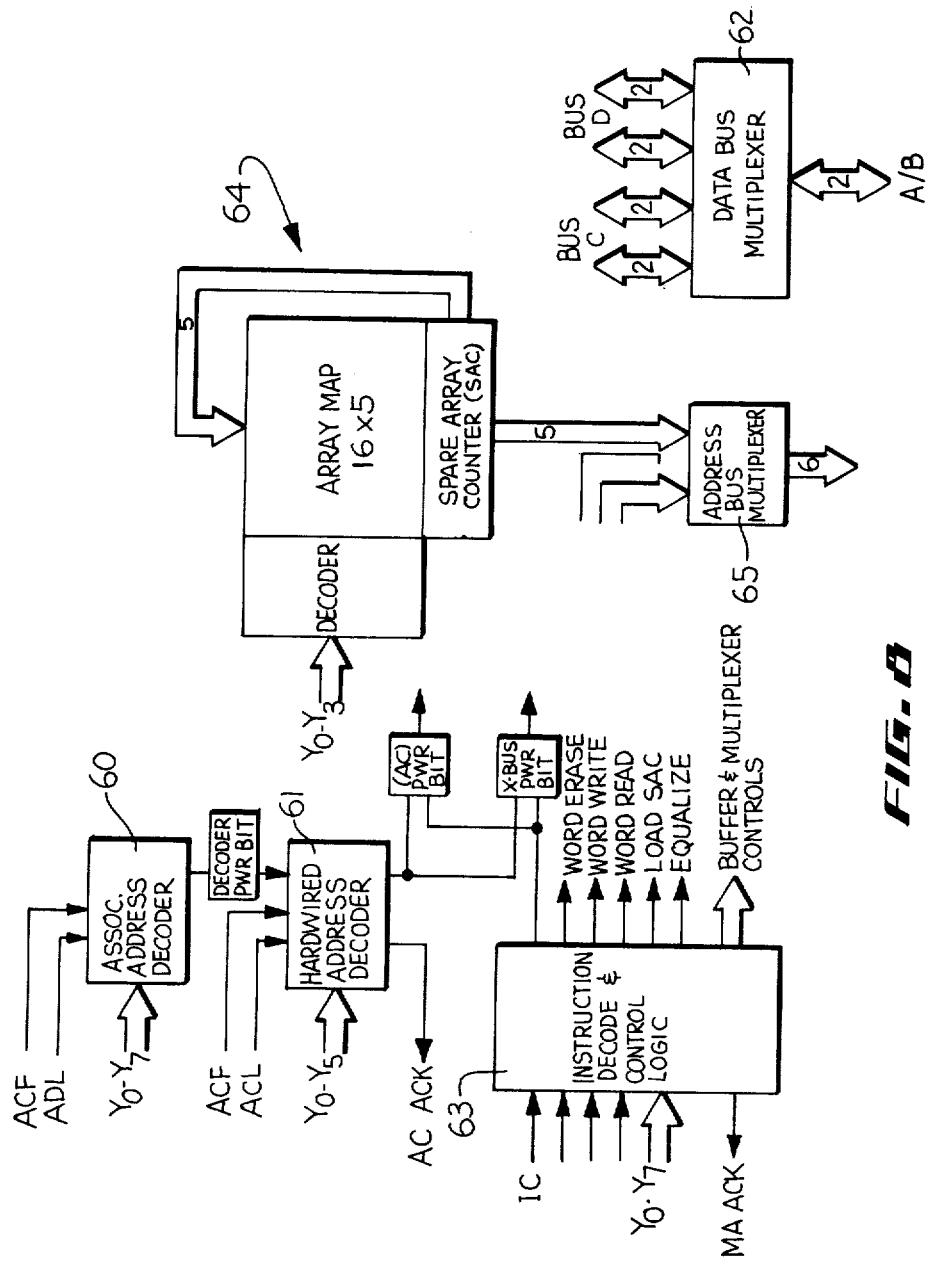
FIG. 9 is a functional diagram of an individual memory array.

The basic component of a memory slice is an MNOS transistor memory array that has the ability to retain data without any standby power. This memory comprises 8192 MNOS cells arranged in a 128 word line×64 bit matrix and utilizes NMOS transistors for peripheral control circuits. The control circuits consist of three main sections: data circuits, addressing circuits, and instruction control circuits. The functional diagram of an individual memory array is shown in FIG. 9.

The data circuits consist of a 64-bit shift register that moves data in or out of the memory at a one megabit/sec rate, and 64 sense amplifiers, one for each bit column in the memory matrix. During a read operation, each sense amplifier functions as a voltage sensor and latch to detect the threshold (logic level) of an addressed MNOS transistor within a matrix column and to transfer these data to an adjacent shift register cell. During a write operation, all data in the memory matrix are initially erased as a block. New data are then shifted in and transferred from the register to the adjacent sense amplifier latches. The resulting logic state of each latch in conjunction with a write pulse applied to an entire row of memory transistors conditionally alters the nonvolatile threshold of an MNOS transistor in each matrix column of that row of memory transistors.

The addressing circuits comprise two sections: a hardwired comparator circuit for addressing and powering the memory array and a register decoder section for addressing a specific row of MNOS transistors in the array matrix. Addressing of the memory array requires two instructions generated from the stack controller and a four-bit address code that is gated onto the X bus from an array controller. The first instruction, an ADF instruction, enables an address comparator circuit in the memory to compare four of the address code bits to a hardwired code. If a match is detected in conjunction with the second instruction, an MAL instruction, an active bit flip-flop is set. The flip-flop in turn sends a memory acknowledge signal (MA-ACK) to the stack controller and switches power to the remaining sections of the memory. The fifth address control bit controls a flip-flop that determines whether I/O data path A or B is used. To save power during extended memory write and erase operations, the hardwired comparator circuit is powered down to a standby state. Because the active bit flip-flop is self-latching after being set, the rest of the memory remains powered until X bus power is removed by the array controller.

Any row within the memory matrix can be randomly addressed. This is accomplished by loading a seven-bit address into an address register and issuing a row address lock (WAL) instruction. The contents of the address register are decoded to a single signal that enables a line driver for the addressed row. The driver's output is normally ground; however, during write operations, the driver supplies +20 volts to the addressed row. During read operations, the selected driver supplies +10 volts.

The first three bits of the X bus, $X_0$ to $X_2$, supply operating instruction codes to the memory. These instructions are differentiated from addressing operands by a command select (CS) signal which enables an instruction encoder and loads the instruction into latches. There are five memory instructions:

a. a shift instruction which, after being latched into memory, is accompanied by 64 clock pulses that shift data in or out of memory;
  b. a transfer instruction that moves data between the matrix memory columns and shift register cells via sense amplifiers;
  c. a read instruction that gates on an addressed row of MNOS transistors in order that their threshold levels can be detected and converted to logic levels by the sense amplifiers;
  d. a write instruction which applies write voltage to a selected row of transistors in order that their threshold states are conditionally set by the logic state of their respective sense amplifiers; and e. an erase instruction which forces all transistors in the memory matrix to a low threshold state with the application of an erase voltage.

The transfer of data either in or out of memory requires a special sequence to the instructions. To transfer data into the memory, the instruction sequence is: shift data in; transfer data; and write. Data are transferred out of the memory by a sequence of: read; transfer; and shift data out instructions.

PACKAGING

In this particular system application, the individual memory slices are designed to be individually packaged in a ceramic carrier package and hermetically sealed. This packaging process is relatively straightforward, and the memory slice can be mechanically attached to the base of the package by either an adhesive epoxy or a fusable alloy preform. Bonding pads within the carrier package will contact the bonding pads on the enclosed memory slice and from there by conductive pathways within the carrier to external contacts on the exterior of the carrier assembly. The assembly and interconnection of a memory slice within the carrier package can be performed by well-established industrial techniques and with readily available equipment. Electrical interconnection of the memory slice pads to the internal package pads is performed by standard wire bonding techniques.

The memory stack is composed of from 67 to 138 hermetically sealed chip carrier packages stacked to a height of about 2.72 to about 2.50 inches. The individual packages are electrically interconnected by bus wire soldered to indented external contacts along one side of each individual carrier package. Since each memory slice is a fully functional operational module which can be easily added or removed from a memory stack, it is clear that the SSM enjoys the advantages of great flexibility and adaptability to a variety of different system applications.

The solid state mass memory system disclosed in detail hereinabove is but one detailed application of the broader concept of this invention. The adaptive wafer scale integration nonvolatile solid state mass memory has general applicability in the solid state mass memory market as well as a replacement for disc and tape drive magnetic media memory units. The individual memory slices can also be used separately by themselves as distributed buffer storage devices. In addition, the designed end reconfigurability of the memory slices, as well as the memory system as a whole, will find wide application as the continued evolution of computing system design requires increased reliability, fault tolerance, and/or self maintenance and adaptive capabilities.

What is claimed is:

1. A nonvolatile solid state mass memory system comprising:
   a plurality of adaptive, wafer scale integration memory wafers wherein an individual memory wafer comprises a plurality of rows with each row containing a first plurality of memory arrays each having a plurality of locations for nonvolatile storage of information and a second plurality of array controllers wherein the memory arrays in the row are operably connected to and uniquely accessed by the array controllers in the row by a first bi-directional bus means and the array controllers are operably connected to a second bi-directional bus means such that only one array controller is operable at one time within a row with the remainder of the functional array controllers serving as inactivated functional redundant spares; and
   a memory system control means comprising means to identify and access an individual memory wafer, means to identify and access individual array controllers via the second bi-directional bus, and interface means to operably connect the nonvolatile solid state mass memory system to an external information processing system.

2. The system of claim 1 further comprising extra functional memory arrays in each row which are utilized as inactivated functional redundant spares.

3. The system of claim 1 wherein each array controller further comprises an associative decoder means comprising a reprogrammable nonvolatile address register means capable of storing a unique address for each wafer.

4. The system of claim 3 further comprising wafer address matching means for comparing for a match between the unique wafer address and a wafer address and control signal from the memory system control means, and wafer array controller enable means responsive to a positive match output from the matching means which energizes the second bi-directional bus and all operable array controllers on the wafer.

5. The system of claim 4 further comprising individual array controller enable means responsive to a positive match signal from array controller address matching means which compare the unique address for an individual array controller with an array controller address and control signal from the memory system control means, the output of the individual array controller enable means de-energizing all unmatched array controllers on the wafer.

6. The matched array controller of claim 4 further comprising reprogrammable nonvolatile array map means containing addresses of individual memory arrays in the row, containing means for translating memory array address and control signals from the memory system control means into an enablement of an individual memory array.

7. The system of claim 6 wherein the array map further comprises spare array counter means, address memory means containing addresses of inactivated functional spare array controllers and memory arrasy within the row and reconfiguration means responsive to reconfiguration signals from the memory system control means such that spare array controllers and memory arrays may be interchanged with active counterparts in the row.

8. The system of claim 7 wherein the reconfiguration means further comprises means for inactivating and isolating a defective array controller.

9. The system of claim 7 wherein the rconfiguration means further comprises means for inactivating and isolating a defective memory array.

10. The system of claim 7 wherein the memory system control means further comprises means for storing a plurality of memory array addresses.

11. The system of claim 7 wherein the memory system control means further comprises means for controlling the operation of the memory arrays.

12. The system of claim 7 wherein the memory system control means further comprises means for testing the operability of the memory wafers.

13. The system of claim 7 wherein the memory system control means comprises means for reconfiguring the addresses in the associative decoder means.

* * * * *

UNITED STATES PATENT AND TRADEMARK OFFICE
CERTIFICATE OF CORRECTION

PATENT NO. : 4,398,248                              Page 1 of 2
DATED      : Aug. 9, 1983
INVENTOR(S): Yukun Hsia; Richard W. Rodgers It is certified that error appears in the above-identified patent and that said Letters Patent is hereby corrected as shown below:

In column 1, line 19, the word [the] should be be. (2nd occurrence)

In column 1, line 36, the word [Indeed] should not be indented.

In column 1, line 40, the word [memorues] should be memories.

In column 1, line 50, [technology media] should be technology is at least competitive with the magnetic media.

In column 4, line 1, the word [remaider] should be remainder.

In column 5, line 37, the word [pularity] should be plurality.

In column 5, line 46, the word [rods] should be words.

In column 6, line 65, delete number [31] after the word [is] and insert a --dash--.

In column 8, line 19, the word [transfornation] should be transformation.

In column 8, line 31, [word register] should be word count register.

In column 10, line 14, the word [inches] should be lines.

UNITED STATES PATENT AND TRADEMARK OFFICE
CERTIFICATE OF CORRECTION

PATENT NO. : 4,398,248

DATED : August 9, 1983

INVENTOR(S) : Yukun Hsia, et al

It is certified that error appears in the above-identified patent and that said Letters Patent is hereby corrected as shown below:

In column 12, line 62, [up six] should be up of six.

In column 16, line 45, the word [arrasy] should be arrays.

Signed and Sealed this

Seventeenth Day of July, 1990

*Attest:*

HARRY F. MANBECK, JR.

*Attesting Officer*      *Commissioner of Patents and Trademarks*